(12) United States Patent
Imler

(10) Patent No.: US 6,518,079 B2
(45) Date of Patent: Feb. 11, 2003

(54) SEPARATION METHOD FOR GALLIUM NITRIDE DEVICES ON LATTICE-MISMATCHED SUBSTRATES

(75) Inventor: William R. Imler, Oakland, CA (US)

(73) Assignee: Lumileds Lighting, U.S., LLC, San Jose, CA (US)

( * ) Notice: Subject to any disclaimer, the term of this patent is extended or adjusted under 35 U.S.C. 154(b) by 0 days.

(21) Appl. No.: 09/741,972

(22) Filed: Dec. 20, 2000

(65) Prior Publication Data

US 2002/0076904 A1 Jun. 20, 2002

(51) Int. Cl.[7] .............................................. H01L 21/302
(52) U.S. Cl. .......................................... 438/33; 438/462
(58) Field of Search .......................... 438/33, 462, 113, 438/114, 22, 25, 26, 460, 977

(56) References Cited

U.S. PATENT DOCUMENTS

| | | | | |
|---|---|---|---|---|
| 5,627,109 A | * | 5/1997 | Sassa et al. ................. | 438/460 |
| 5,972,781 A | * | 10/1999 | Wegleiter et al. ........... | 438/460 |
| 5,994,205 A | * | 11/1999 | Yamamoto et al. .......... | 438/464 |
| 6,080,599 A | * | 7/2000 | Yamamoto et al. ........... | 438/33 |
| 6,100,104 A | * | 8/2000 | Hearle .......................... | 438/33 |
| 6,107,162 A | * | 8/2000 | Morita et al. ................ | 438/462 |
| 6,156,584 A | * | 12/2000 | Itoh et al. ..................... | 438/33 |
| 6,168,962 B1 | * | 1/2001 | Itoh et al. ..................... | 438/22 |
| 6,261,929 B1 | * | 7/2001 | Gehrike et al. ............. | 438/478 |

* cited by examiner

*Primary Examiner*—Savitri Mulpuri
(74) *Attorney, Agent, or Firm*—Patent Law Group LLP; Brian D. Ogonowsky

(57) ABSTRACT

A method for separating semiconductor devices is disclosed. The method includes providing a substrate having one or more epitaxial layers formed thereon, forming trenches in the one or more epitaxial layers, forming scribe lines in a surface of the substrate, wherein the locations of the scribe lines correspond to the locations of the trenches, and separating the semiconductor devices by cracking the wafer along the scribe lines.

14 Claims, 9 Drawing Sheets

SEPARATION METHOD FOR GALLIUM NITRIDE DEVICES ON LATTICE-MISMATCHED SUBSTRATES

FIELD OF THE INVENTION

The present invention relates to a technique for separating semiconductor dies from a wafer and, in particular, to a technique for separating gallium nitride light emitting diode devices on lattice-mismatched substrates.

BACKGROUND

Light emitting diodes (LEDs) such as gallium nitride (GaN) LEDs are used in a wide variety of applications. GaN LEDs are commonly fabricated by forming one or more GaN epitaxial layers over a top surface of a lattice mismatched wafer substrate, such as a sapphire substrate. The bottom surface of the substrate is then scribed using a scribing tool. The scribing process creates scribe lines which define the dimensions of the LED devices. The substrate is then broken along the scribe lines, yielding individual LED devices.

The conventional scribe and break process results in devices that have rough edges, and thus a poor visual appearance. The process can also result in devices that have damaged electrical contacts or bond pads due to randomly propagating cracks. During the breaking process, cracks develop at the scribe lines on the surface of the substrate. The cracks then propagate through the substrate. When the cracks reach the substrate/epitaxial layer interface, the cracks tend to propagate in unanticipated and undesirable directions. This is due to the high stress and large number of defects at this interface, caused by the mismatched lattice patterns of the substrate and the GaN layer. Finally, the cracks propagate through the epitaxial layer and break through the top surface of the epitaxial layer. At the very least, this separation method results in individual devices which have rough or jagged edges. However, the propagating cracks frequently break out of the scribe line areas into the active areas of the device, damaging electrical contacts or bond pads located therein.

What is needed is a technique for separating GaN devices on lattice-mismatched substrates which overcomes the disadvantages mentioned above.

SUMMARY

A technique which overcomes the disadvantages mentioned above is disclosed.

In one embodiment, a method for separating semiconductor devices is disclosed. The method includes providing a substrate having one or more epitaxial layers thereon, forming trenches in the one or more epitaxial layers, forming scribe lines in a surface of the substrate, wherein the locations of the scribe lines correspond to the locations of the trenches, and separating the semiconductor devices by cracking the substrate along the scribe lines.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION

The preferred embodiments of the present invention and their advantages are best understood by referring to FIGS. 1 through 9 of the drawings. Like numerals are used for like and corresponding parts of the various drawings.

A method for separating GaN devices on lattice-mismatched substrates in accordance with the present invention is now described. The method is described with reference to FIGS. 1 through 9.

Figure 1:
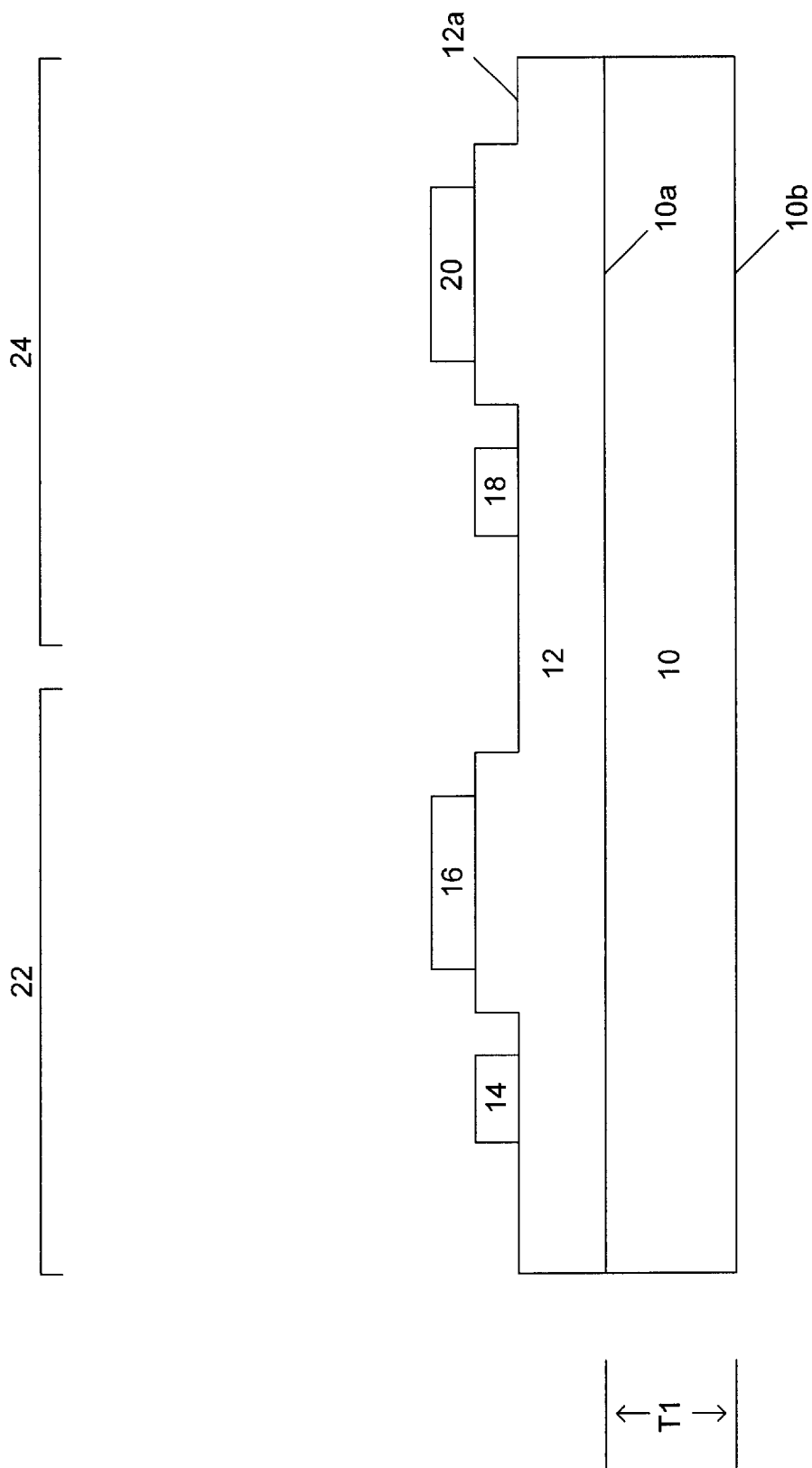
FIG. 1 shows a cross section of a portion of a wafer having two LED devices, in accordance with the present invention.

In step 1, a portion of a wafer having two LED devices formed thereon is provided as shown in FIG. 1. A gallium nitride (GaN) epitaxial layer 12 having a top surface 12a is disposed on a sapphire substrate 10. Sapphire substrate 10 includes a top surface 10a, a bottom surface 10b, and a thickness T1. N contacts 14 and 18 and P contacts 16 and 20 are then formed on GaN epitaxial layer 12. N contact 14 and P contact 16 provide electrical connections to a first LED device 22, and N contact 18 and P contact 20 provide electrical connections to a second LED device 24. The structure shown in FIG. 1 can be formed by techniques well known in the art.

In addition to sapphire, other suitable materials such as silicon carbide or GaP can be used for substrate 10. Other suitable III—V materials such as ALGaN, InGaN, AlInGaN, AlGaInP can be used for epitaxial layer 12. Such layers may also include P and N-type dopants. Although epitaxial layer 12 is shown as a single layer, it should be recognized that epitaxial layer 12 can include multiple layers. It should also be noted that wafers having the structures of FIG. 1 formed thereon can be tested prior to performing the processing steps described below. Such testing ensures that only wafers with acceptable yield are further processed.

One example of forming an LED is found in U.S. Pat. No. 6,133,589 by Michael Krames et al., incorporated herein by reference.

Figure 2:
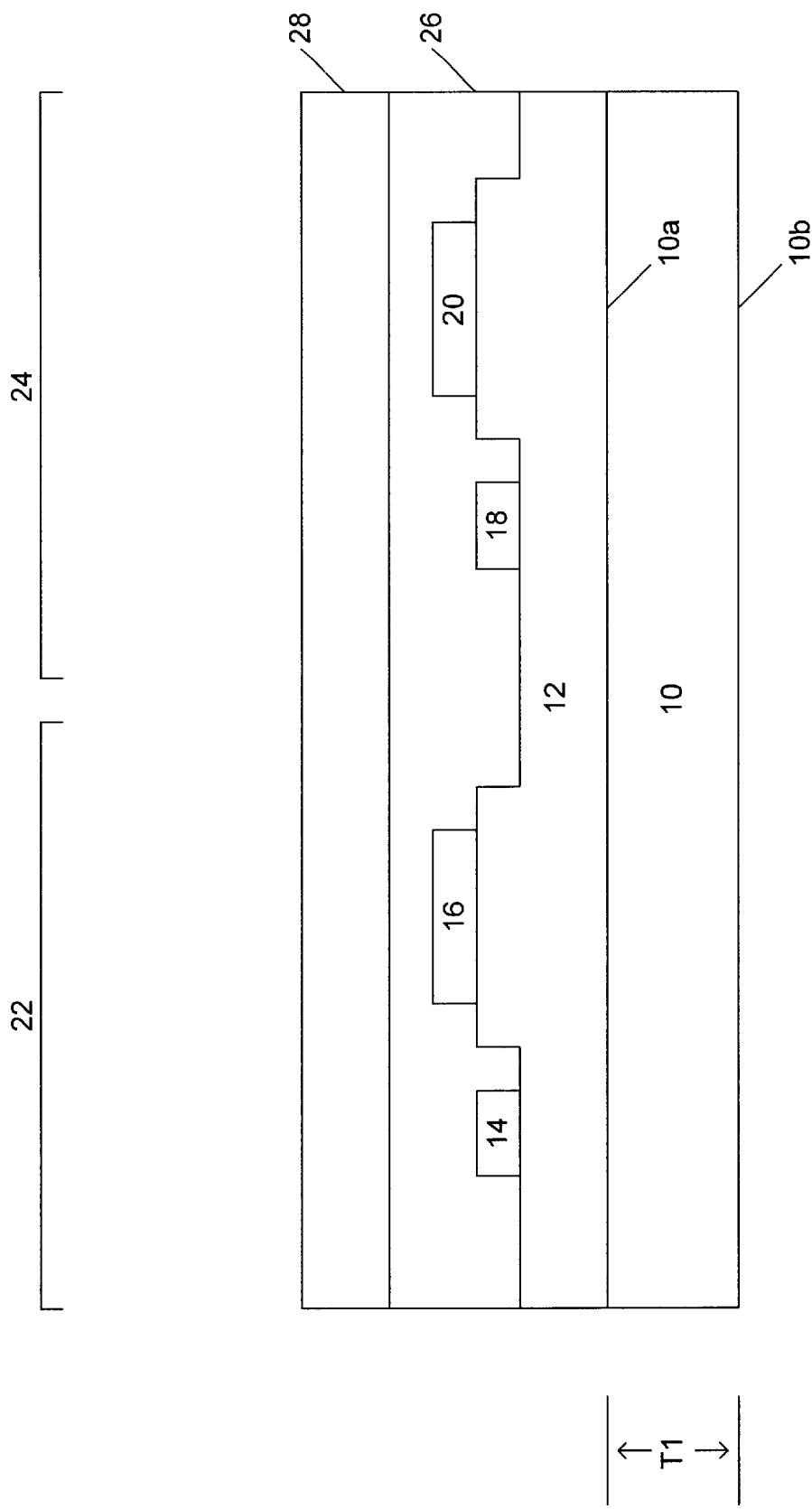
FIG. 2 shows the wafer of FIG. 1 after a mask layer and a photoresist layer have been deposited thereon, in accordance with the present invention.

In step 2, a mask material and a photoresist layer are formed over the structure of FIG.1 as shown in FIG. 2. First, a mask layer 26 is formed over top surface 12a of epitaxial layer 12, N contacts 14 and 18, and P contacts 16 and 20. Then, a photoresist layer 28 is formed over mask layer 26. Suitable mask materials includes metals, dielectrics, photoresist, and combinations of multiple layers of all of these materials.

Figure 3:
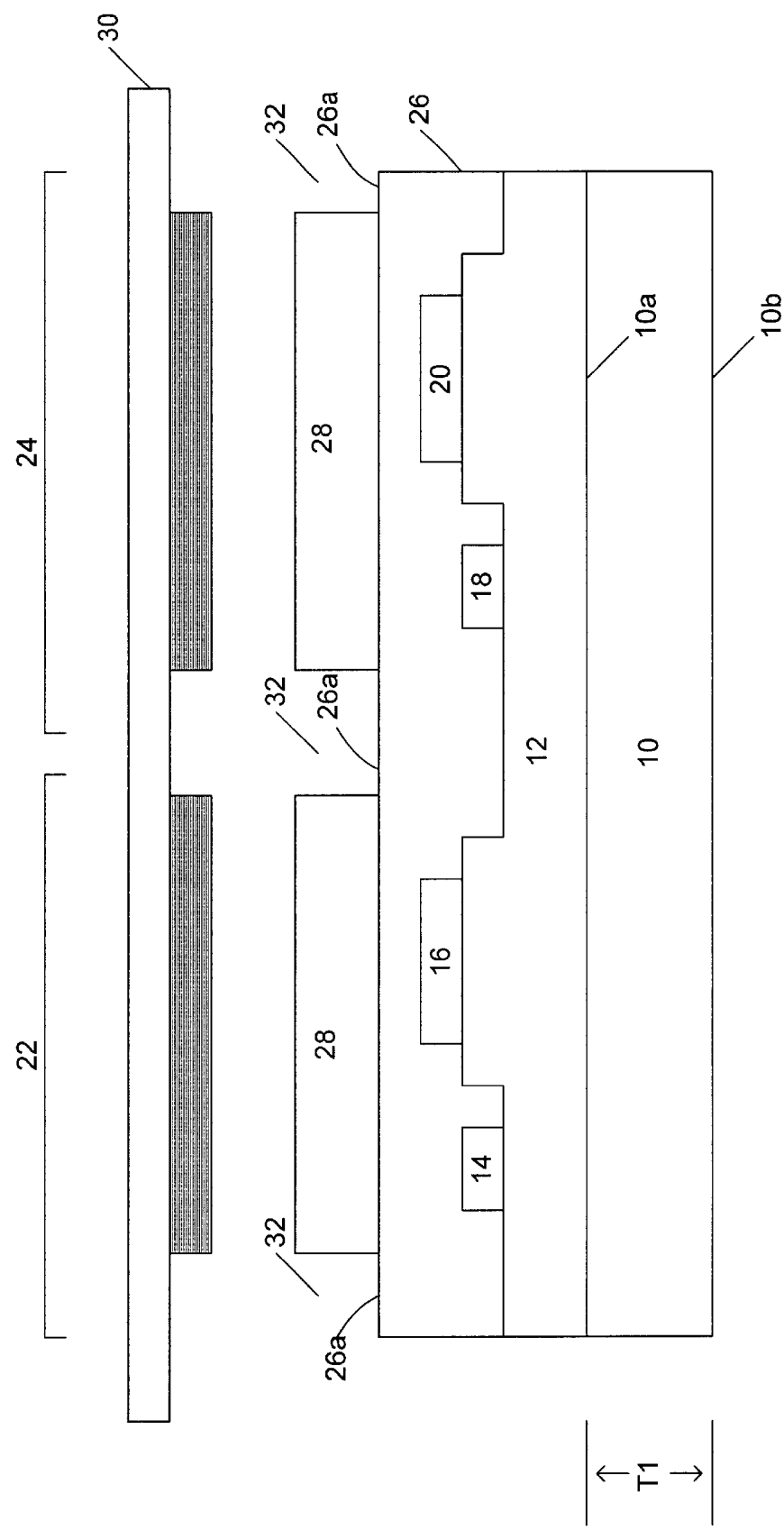
FIG. 3 shows the wafer of FIG. 2 after the photoresist layer has been exposed and developed, in accordance with the present invention.

In step 3, the photoresist layer is exposed and developed as shown in FIG. 3. First, a photomask 30 is used to expose portions of photoresist layer 28 to a light source corresponding to where openings 32 are to be formed. Then, the exposed areas of photoresist layer 28 are developed resulting in the formation of openings 32. The formation of openings 32 expose a top surface 26a of mask layer 26. A negative photoresist layer may be used instead, requiring an opposite exposure photomask 30.

Figure 4:
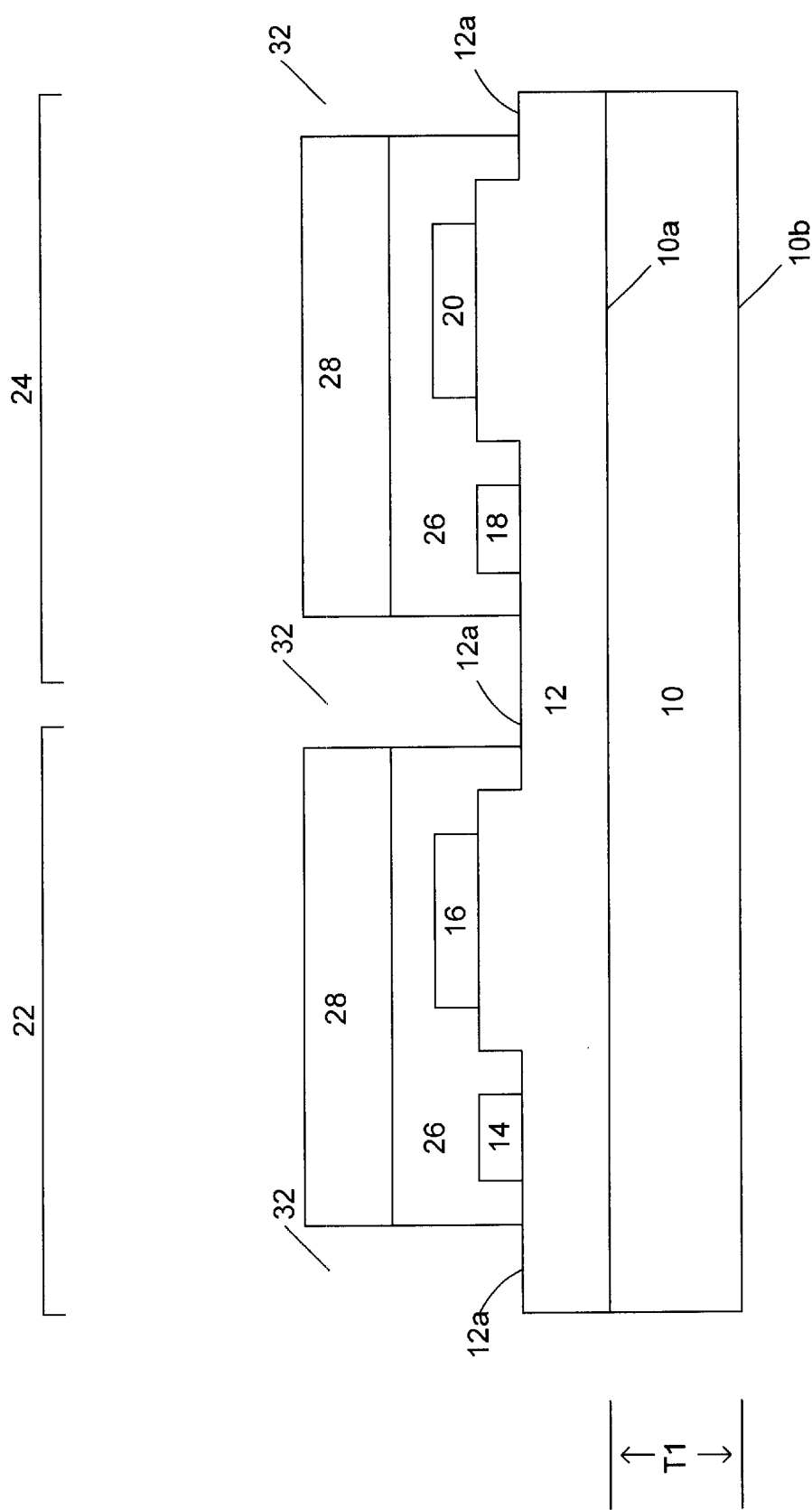
FIG. 4 shows the wafer of FIG. 3 after the mask layer has been etched, in accordance with the present invention.

In step 4, the mask layer is etched as shown in FIG. 4. In this step, a conventional etching solution for the particular mask material is used to remove portions of mask layer 26 exposed by openings 32. This etching process continues until top surface 12a of epitaxial layer 12 is exposed in areas corresponding to openings 32.

Figure 5:
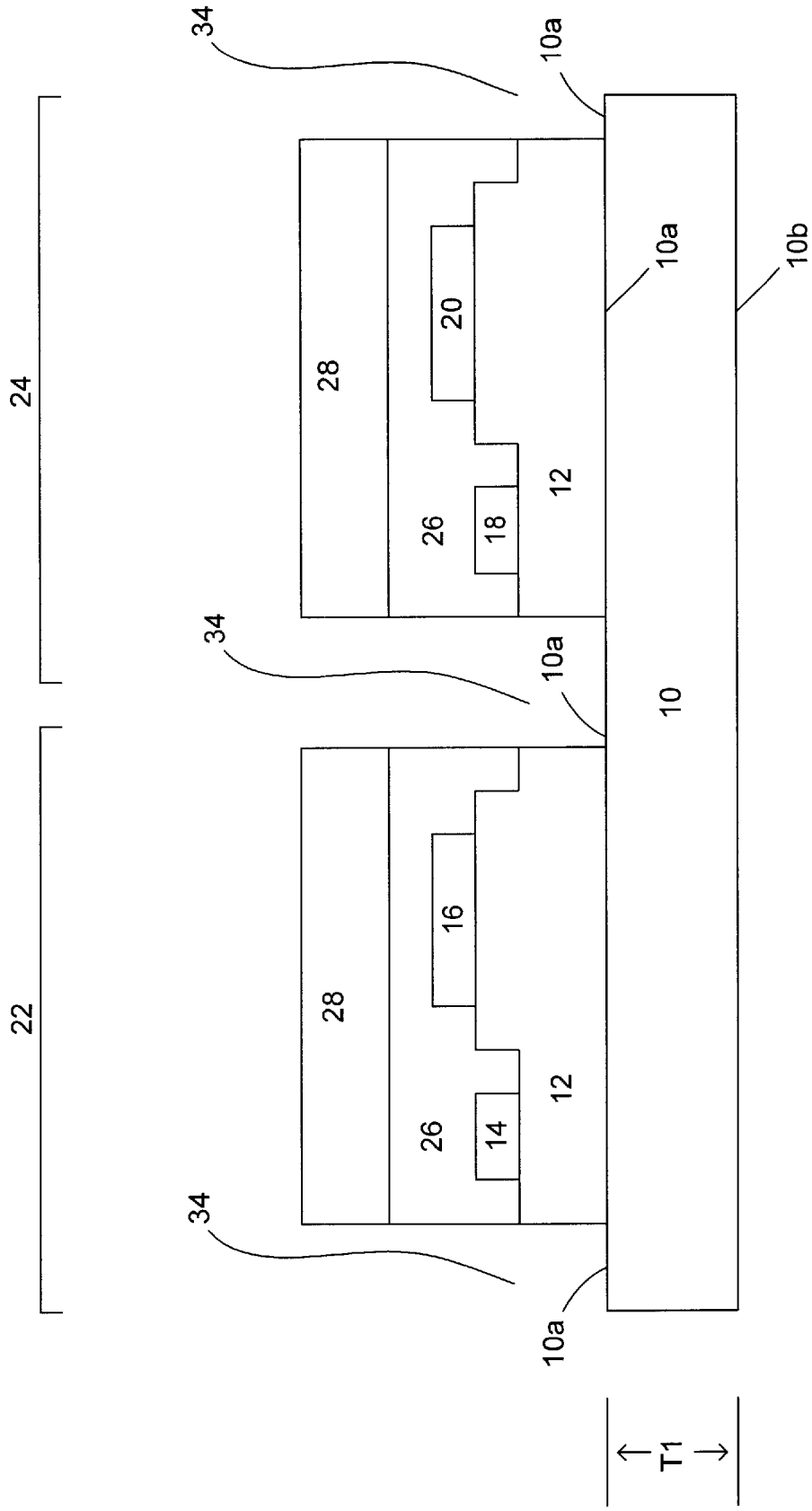
FIG. 5 shows the wafer of FIG. 4 after the epitaxial layer has been etched, in accordance with the present invention.

In step 5, the epitaxial layer is etched as shown in FIG. 5. In this step, etchant is used to remove portions of epitaxial layer 12 corresponding to openings 32 (FIG. 4). This etching process continues until top surface 10a of substrate 10 is exposed, thereby forming trenches 34. This step can be performed by placing the wafer into a reactive ion etching (RIE) machine for an appropriate time, which is determined by the thickness of the epitaxial layer and the exact etching conditions used. A wide variety of etchants such as chlorine based etchants can be used to etch the epitaxial layer.

Figure 6:
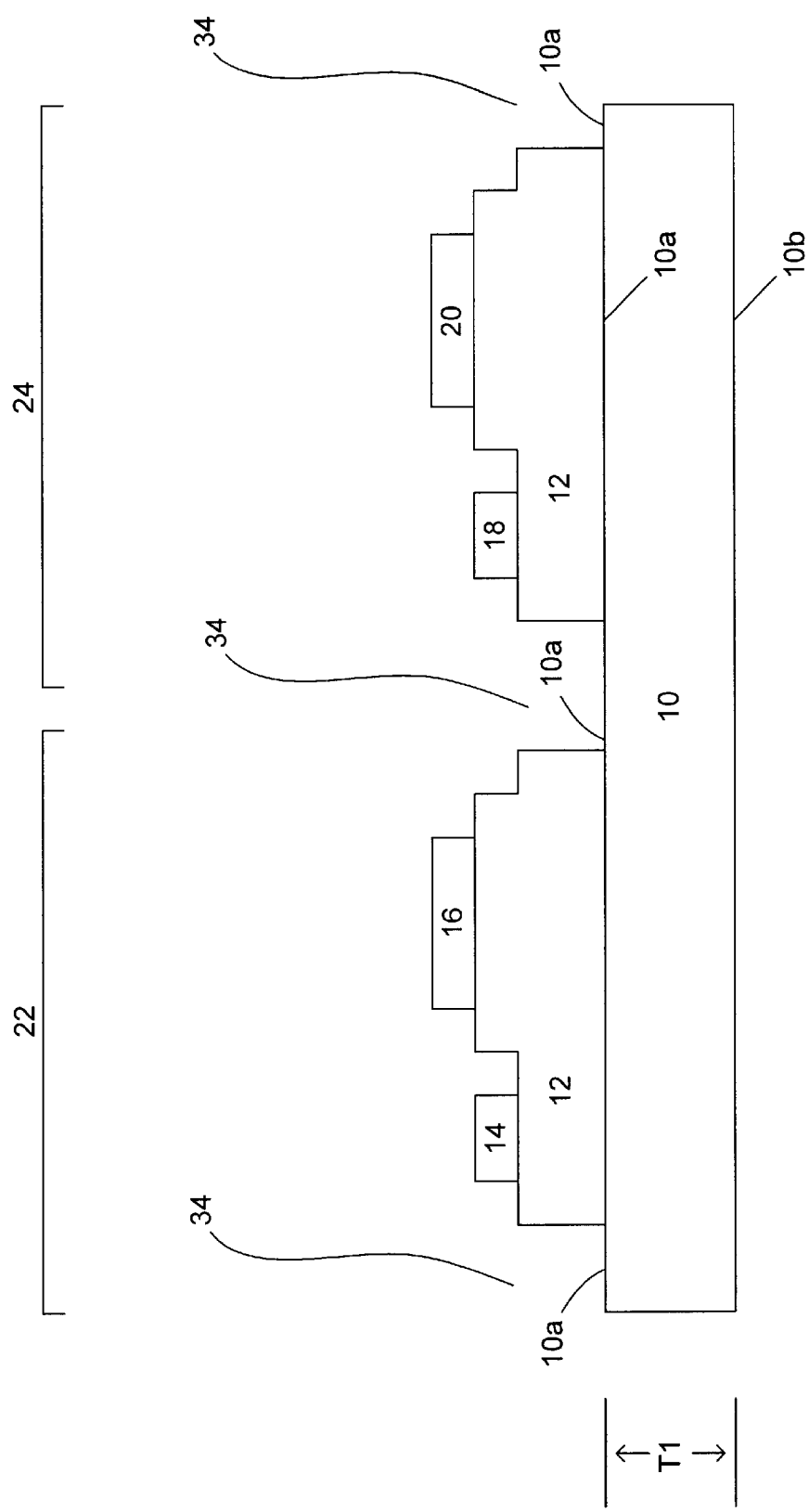
FIG. 6 shows the wafer of FIG. 5 after the photoresist and the mask layers have been removed, in accordance with the present invention.

In step 6, the photoresist and the mask layers are removed as shown in FIG. 6. The remaining portions of photoresist layer 28 and mask layer 26 are removed using techniques well known in the art. The remaining structure is similar to the structure of FIG. 1 except that trenches 34 have been formed in epitaxial layer 12.

Figure 7:
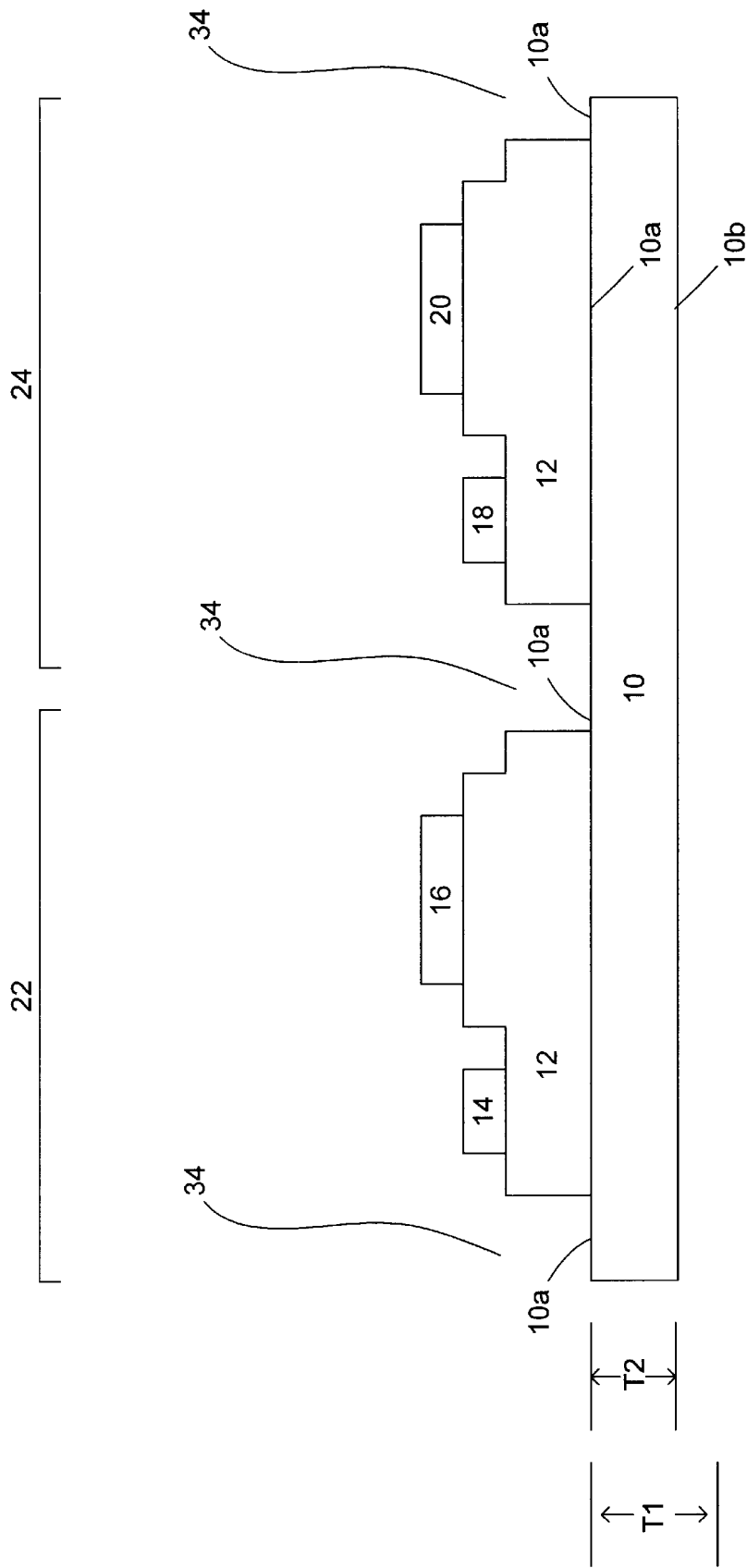
FIG. 7 shows the wafer of FIG. 6 after the substrate has been back thinned, in accordance with the present invention.

In step 7, the bottom surface of the substrate is thinned or polished as shown in FIG. 7. Bottom surface 10b of substrate 10 can be thinned by various techniques such as lapping or grinding such that thickness of the substrate is optimal. Note that the thickness T2 of substrate 10 as shown in FIG. 7 is less than the thickness T1 of substrate 10 prior to the thinning process. In one embodiment, an original substrate thickness of 430 microns is thinned to a thickness of 105 microns.

Figure 8:
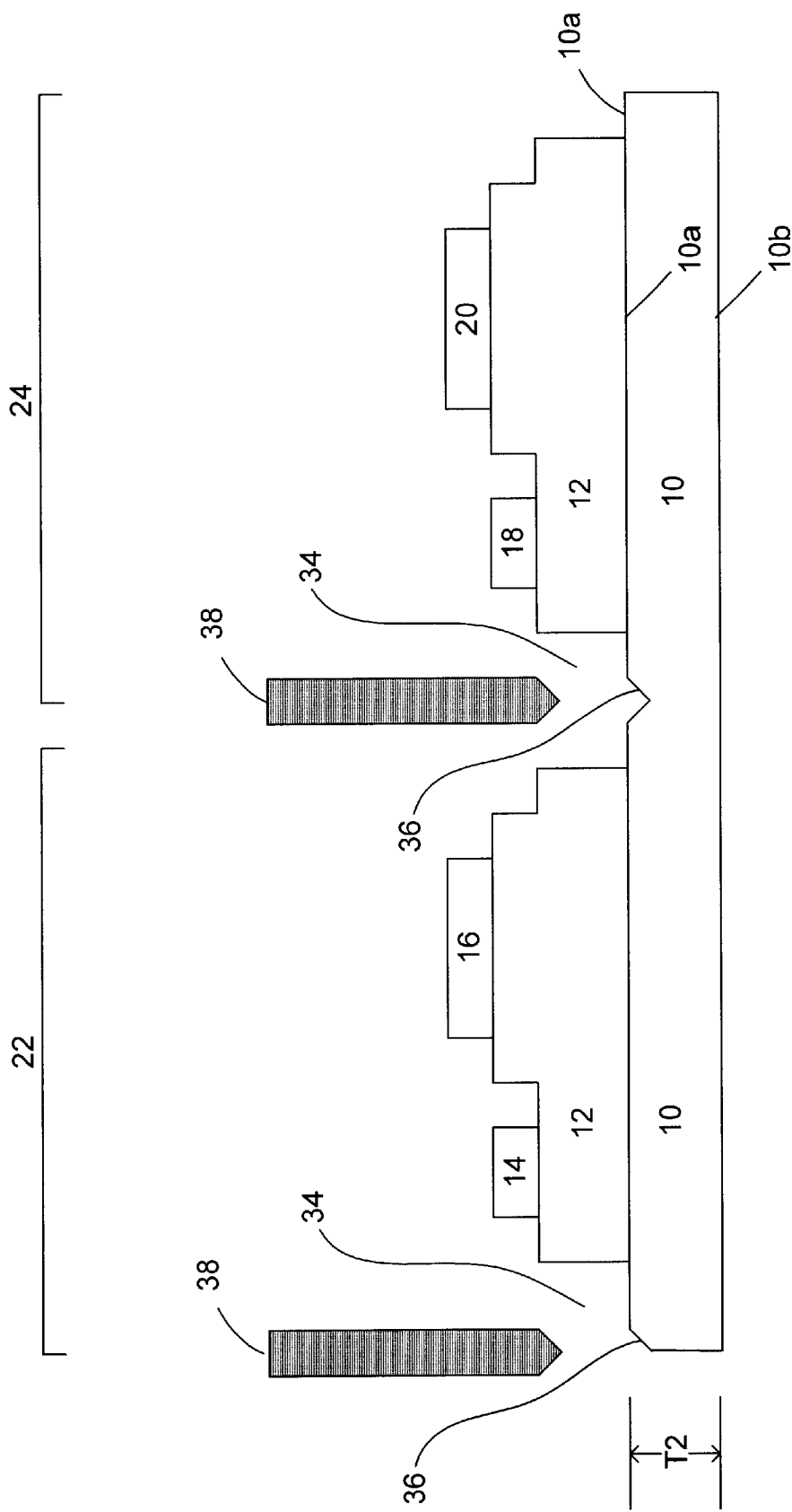
FIG. 8 shows the wafer of FIG. 7 after the substrate has been scribed, in accordance with the present invention.
Figure 9:
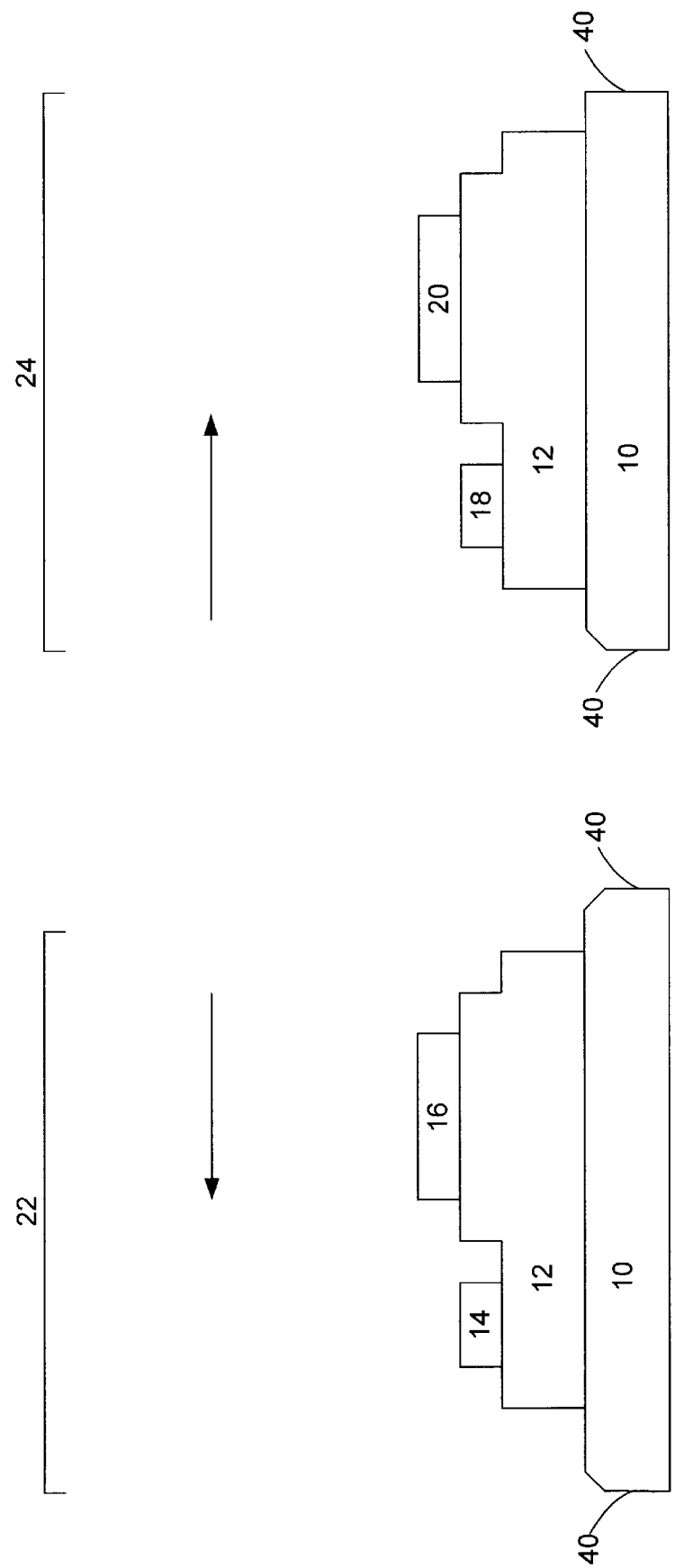
FIG. 9 shows the wafer of FIG. 8 after the two LED devices have been separated, in accordance with the present invention.

In step 8, the substrate is scribed using a scribe tool as shown in FIG. 8. A scribe tool 38 is lowered into trench 34 generating a force on top surface 10a of substrate 10. Scribe tool 38 is then moved across top surface 10a of substrate 10, using conventional equipment, causing a scribe line 36 to be formed in top surface 10a of substrate 10. Alternatively, scribe line 36 can be formed on bottom surface 10b of substrate 10 opposite trench 34 (not shown).

In step 9, the first LED device and the second LED device are separated along scribe line 36. First LED device 22 and second LED device 24 can be separated using well known breaking techniques, such as adhering the wafer to an elastic layer then bending the wafer around a curved surface. Using such techniques, cracks originate at top surface 10a of substrate 10 where scribe line 36 is formed. The cracks then propagate through substrate 10 until they reach bottom surface 10b of substrate 10 where they break through, thereby separating the LED devices. Alternatively, if scribe line 36 is formed on bottom surface 10b of substrate 10, cracks originate at bottom surface 10b of substrate 10 where scribe line 36 is formed and then propagate through substrate 10 until they reach top surface 10a of substrate 10 where they break through, thereby separating the LED devices.

Thus a method for separating LED devices on lattice-mismatched substrates has been described. According to the method of the present invention, the cracks which form in the break step propagate through the substrate only. The cracks do not propagate through the epitaxial layer or the interface between the epitaxial layer and the substrate layer as they would according to conventional separation techniques. Since the cracks do not propagate through the epitaxial layer or the interface between the epitaxial layer and the substrate layer, the cracks do not travel in unanticipated and undesirable directions, as they would according to conventional separation techniques. As a result, the dimensions of the LED devices formed in accordance with the present invention are easier to control and have greater definition.

The disclosed method for separating LED devices on lattice-mismatched substrates provides several noteworthy advantages. First, fewer devices are rejected during the manufacturing process due to poor visual appearance. This is because the edges of the devices fabricated according to the present invention are relatively smooth rather than being jagged. Second, fewer devices are rejected during the manufacturing process due to damaged electrical contacts or bond pads. This is because the propagation of the cracks are more easily controlled and do not propagate randomly into the electrical contact and bond pad areas of the device. Third, the light emitting areas of the LED devices are more uniform. Since the edges of the device are smoother, and the devices have more uniform dimensions, the active portion of each device is approximately equal. As a result, the current density for each device at a fixed current is constant. This improves the uniformity of injection efficiency, operating forward voltage, and the light output. Fourth, since the dimensions of each device are approximately equal, assembly yield and speed is improved since fewer devices will be rejected due to nonuniformity. Fifth, radiation patterns are improved since the edges of the devices are more vertical and uniform. Sixth, the quality of white light products having a phosphor coating can be improved since the phosphor coating covers the same light emitting area in every device. Using conventional processes, the phosphor coating would be thicker on a smaller device, resulting in a more yellowish color, whereas the phosphor coating would be thinner on a larger device, resulting in a more bluish color. Seventh, the present invention allows scribing on the top (device) side as well as on the bottom side of the substrate.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method for separating semiconductor devices comprising:
   providing a sapphire or silicon carbide substrate having one or more epitaxial layers thereon, the epitaxial layers including at least one GaN layer;
   forming trenches in the one or more epitaxial layers;
   forming scribe lines in a surface of the substrate, wherein the locations of the scribe lines correspond to the locations of the trenches; and
   separating the semiconductor devices by cracking the substrate along the scribe lines.

2. The method of claim 1 wherein forming the trenches exposes a top surface of the substrate.

3. The method of claim 1 wherein the trenches and the scribe lines correspond to the perimeters of the semiconductor devices.

4. The method of claim 1 wherein the scribe lines are formed in the surface of the substrate supporting the epitaxial layers.

5. The method of claim 1 wherein the scribe lines are formed in a surface of the substrate opposite the trenches.

6. The method of claim 1 wherein the epitaxial layers form a light emitting structure.

7. The method of claim 1 wherein the epitaxial layers are grown over the substrate.

8. A method comprising:

provideing a sapphire or silicon carbide substrate having one or more epitaxial layers, including at least one GaN layer, formed on a top surface of the substrate;

forming a trench in the one or more epitaxial layers;

forming a scribe line in the substrate, wherein the location of the scribe line corresponds to the location of the trench; and cracking the substrate along the scribe line.

9. The method of claim 8 wherein forming a scribe line in the substrate comprises:

forming a scribe line in the top surface of the substrate.

10. The method of claim 8 wherein forming a scribe line in the substrate comprises:

forming a scribe line in a bottom surface of the substrate.

11. The method of claim 8 wherein forming a trench exposes the top surface of the substrate.

12. The method of claim 8 wherein the trench and the scribe line both correspond to one side of a semiconductor device.

13. The method of claim 8 wherein the epitaxial layers form a light emitting structure.

14. The method of claim 8 wherein the epitaxial layers are grown over the substrate.

* * * * *